(12) United States Patent
Jellus et al.

(10) Patent No.: US 8,659,295 B2
(45) Date of Patent: Feb. 25, 2014

(54) METHOD AND DEVICE FOR MAGNETIC RESONANCE IMAGING

(75) Inventors: Vladimir Jellus, Erlangen (DE); Lars Lauer, Nuremberg (DE); Dominik Paul, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 377 days.

(21) Appl. No.: 13/193,944

(22) Filed: Jul. 29, 2011

(65) Prior Publication Data

US 2012/0025823 A1    Feb. 2, 2012

(30) Foreign Application Priority Data

Jul. 30, 2010    (DE) .................... 10 2010 032 825

(51) Int. Cl.
*G01V 3/00*    (2006.01)
(52) U.S. Cl.
USPC .............................................. 324/309
(58) Field of Classification Search
USPC ............................................ 324/300–322
See application file for complete search history.

(56) References Cited

U.S. PATENT DOCUMENTS

| 3,629,697 | A | * | 12/1971 | Bouchiat et al. | 324/301 |
| 5,272,437 | A | * | 12/1993 | Wardenier | 324/322 |
| 7,492,349 | B2 | * | 2/2009 | Feiweier et al. | 345/156 |
| 2010/0286502 | A1 | | 11/2010 | Van Zijl et al. | |
| 2013/0099785 | A1 | * | 4/2013 | Li et al. | 324/309 |
| 2013/0249550 | A1 | * | 9/2013 | Feiweier et al. | 324/309 |

OTHER PUBLICATIONS

Ling et al: "Assessment of glycosaminoglycan concentration in vivo by chemical exchange-dependent saturation transfer (gagCEST)," Proc Natl Acad Sci USA, 2008, 105(7);2266-2270.
Lu et al: "A New, Polynomial-Based (PARA)CEST Analysis Method with B0 correction and Increased Sensitivity," Proc. Intl. Soc. Mag. Reson. Med. 17(2009), 183.
Sun et al: "Correction for artifacts induced by $B_0$ and $B_1$ field inhomogeneities in pH-sensitive chemical exchange saturation transfer (CEST) imaging", Magn. Res. Med., 58, 2007, pp. 1207-1215.
Liu et al: "High-throughput screening of chemical exchange saturation transfer MR contrast agents", Contrast Media Mol. Imaging, in: Contrast Media Mol. Imaging, 5, 2010, pp. 162-170.
Zhou et al: "Chemical exchange saturation transfer imaging and spectroscopy", Progress NMR Spectroscopy, 48, 2006, pp. 109-136.

* cited by examiner

*Primary Examiner* — Dixomara Vargas
(74) *Attorney, Agent, or Firm* — Schiff Hardin LLP

(57) ABSTRACT

In a methods and devices for magnetic resonance (MR) imaging, an MR data acquisition is implemented repeatedly in which an examination subject is exposed to an alternating magnetic field with a frequency before the readout sequence. The signal values acquired after the preparation of the magnetization with alternating fields of respectively different frequencies are evaluated. Magnetic field data that contain information about the curve of the basic field are used to implement the MR data acquisitions, such as to establish the frequencies, and/or in the evaluation of the signal values.

18 Claims, 9 Drawing Sheets

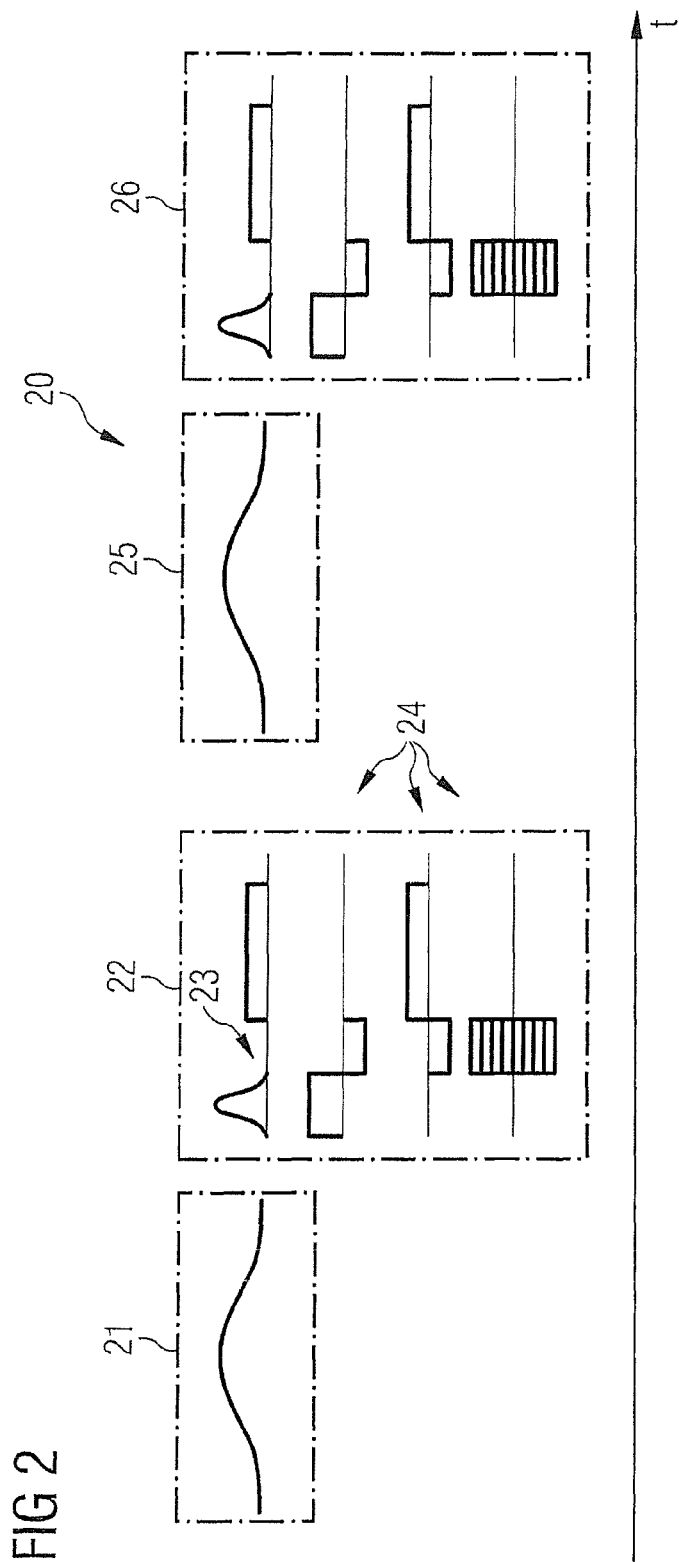

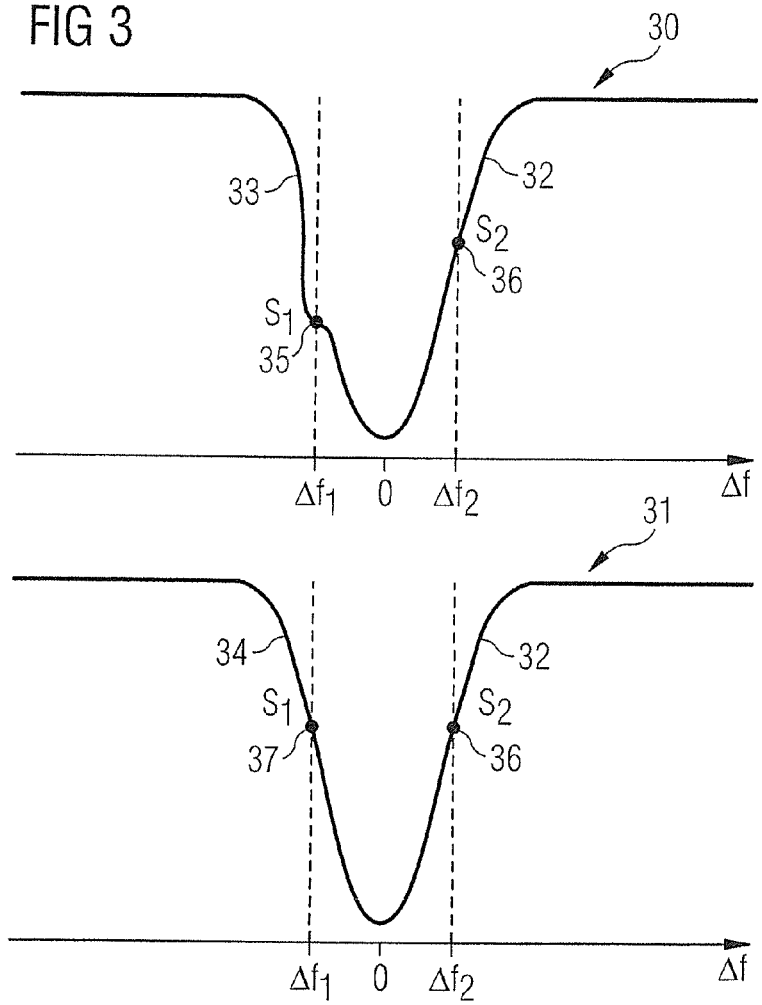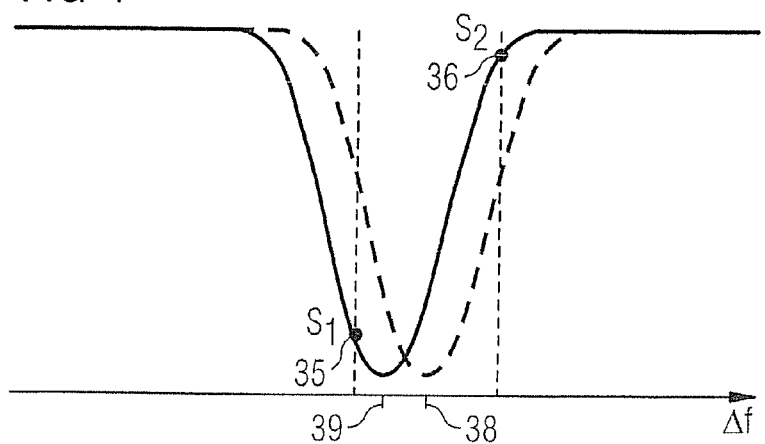

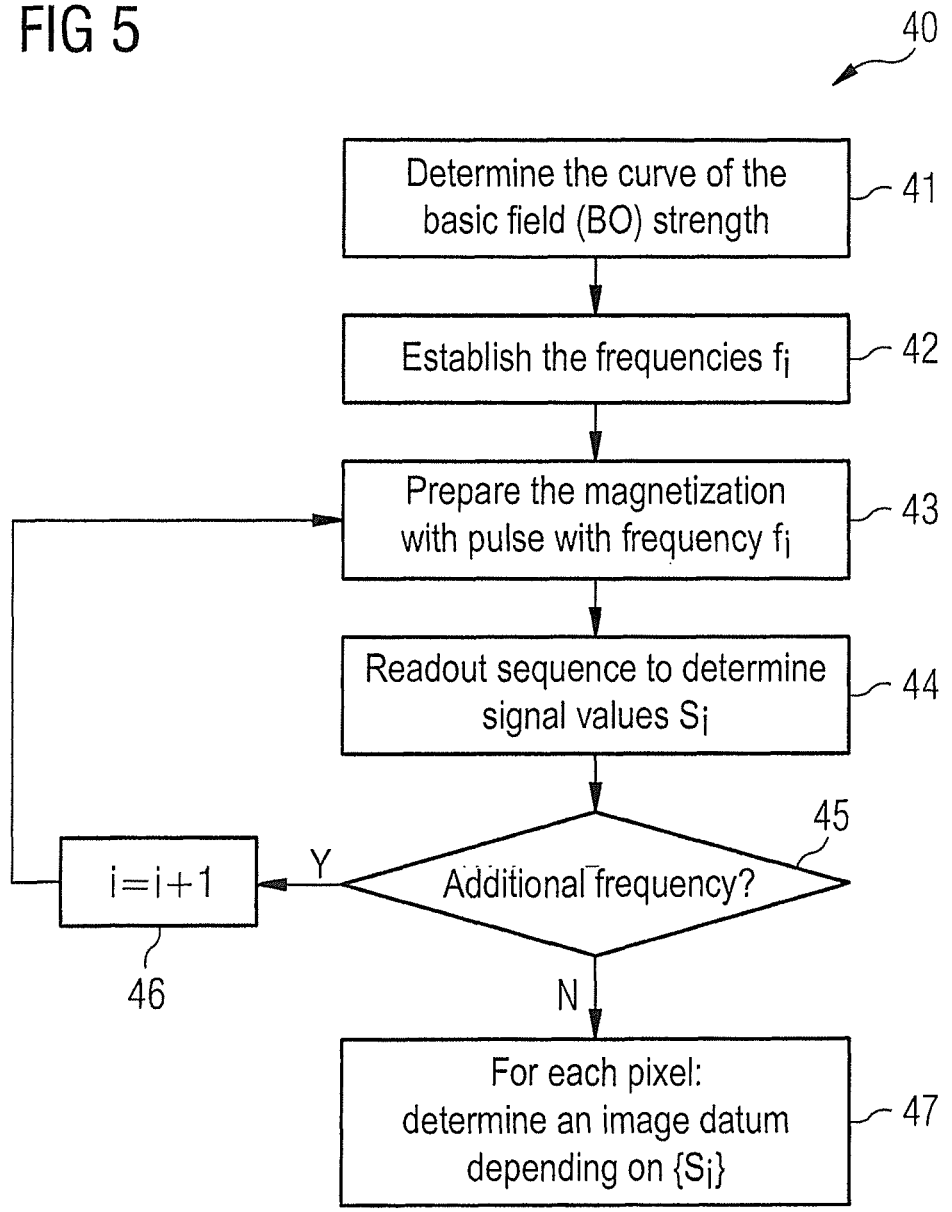

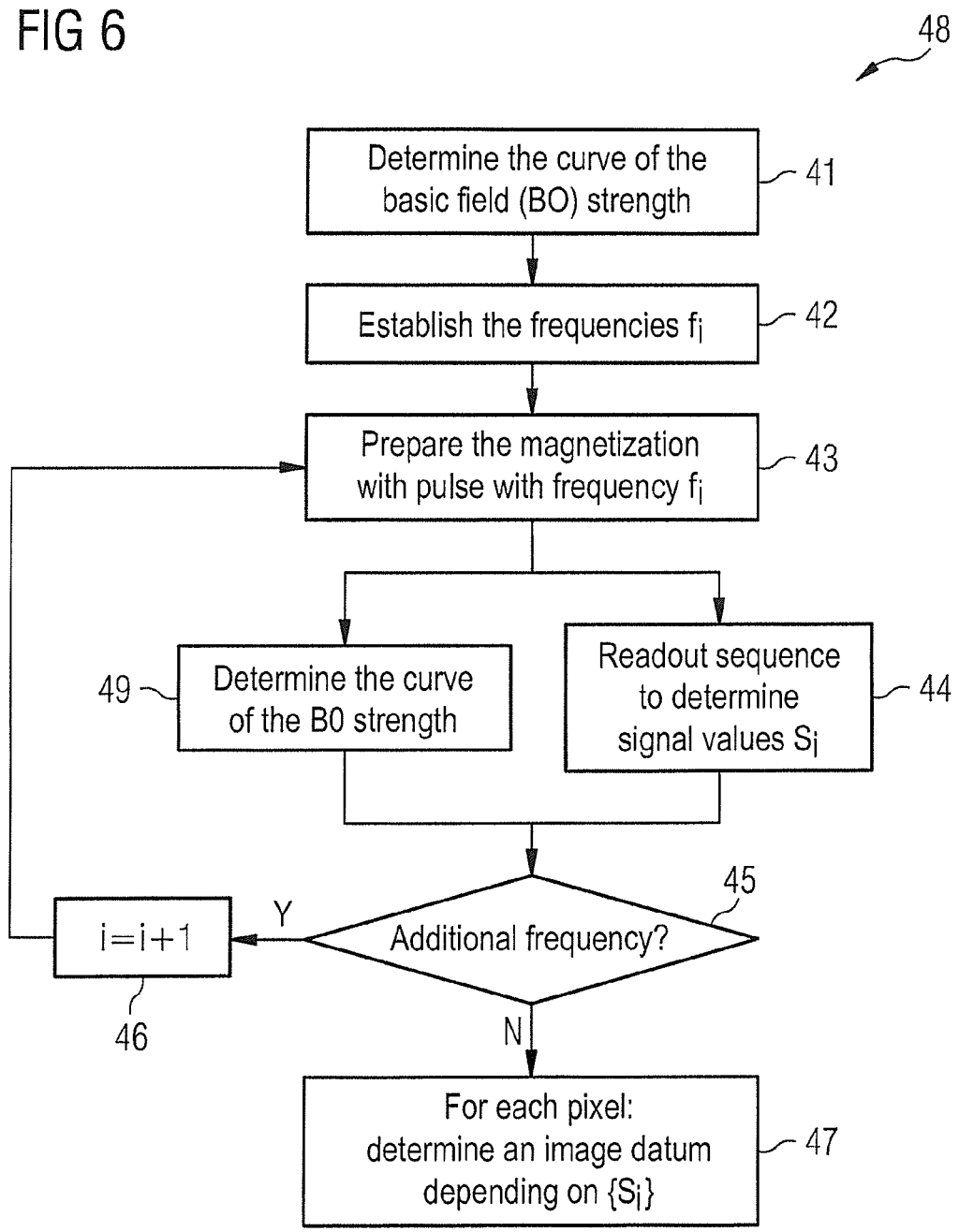

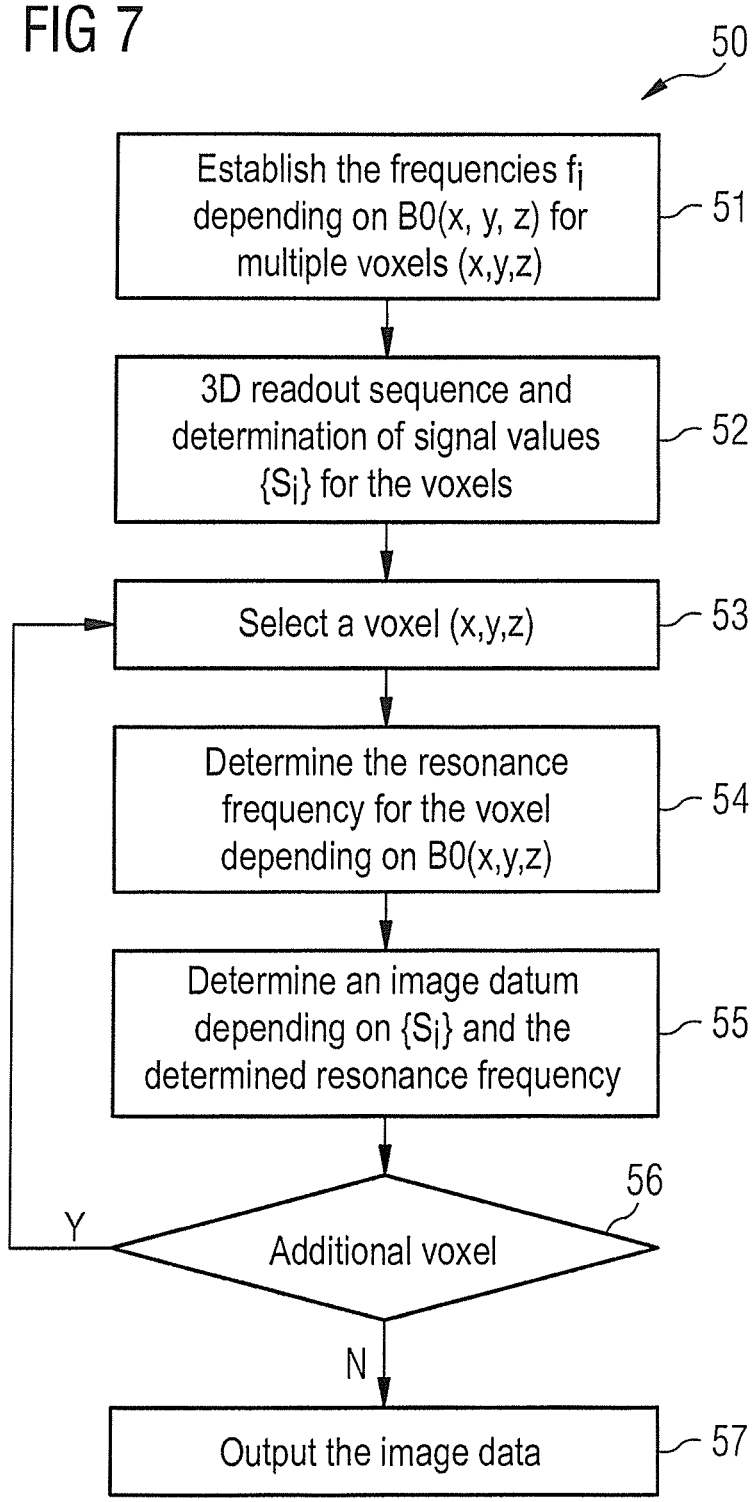

FIG 8
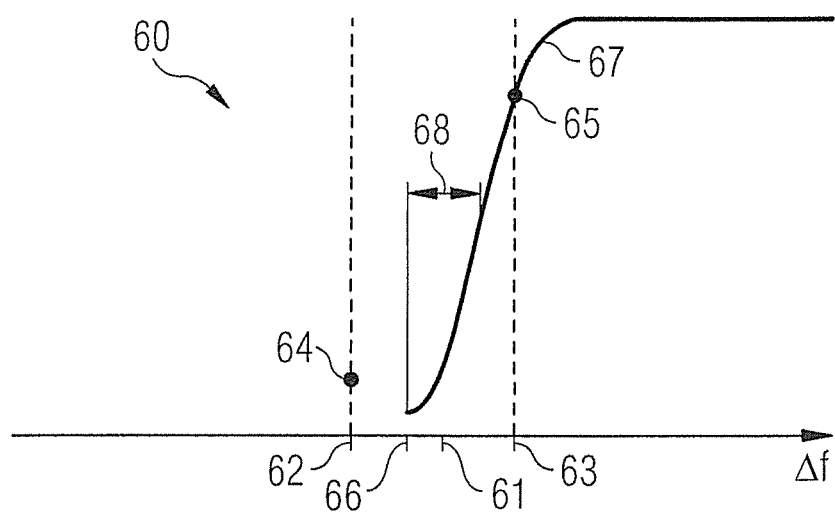
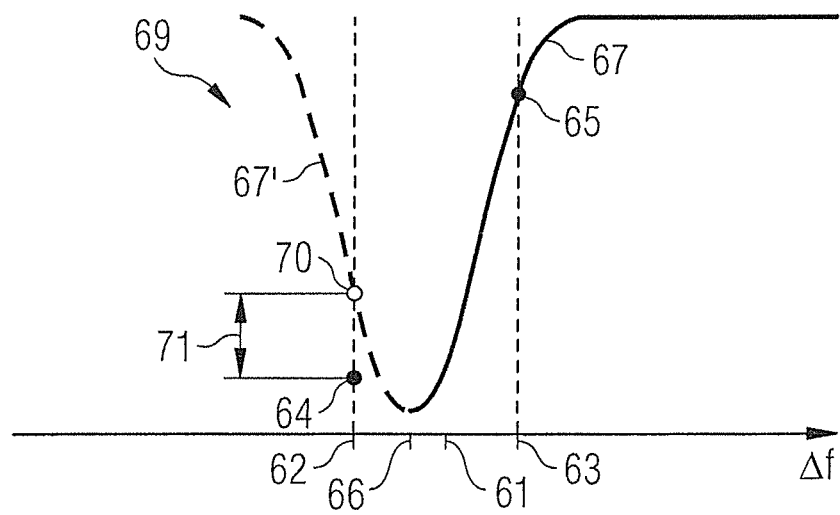

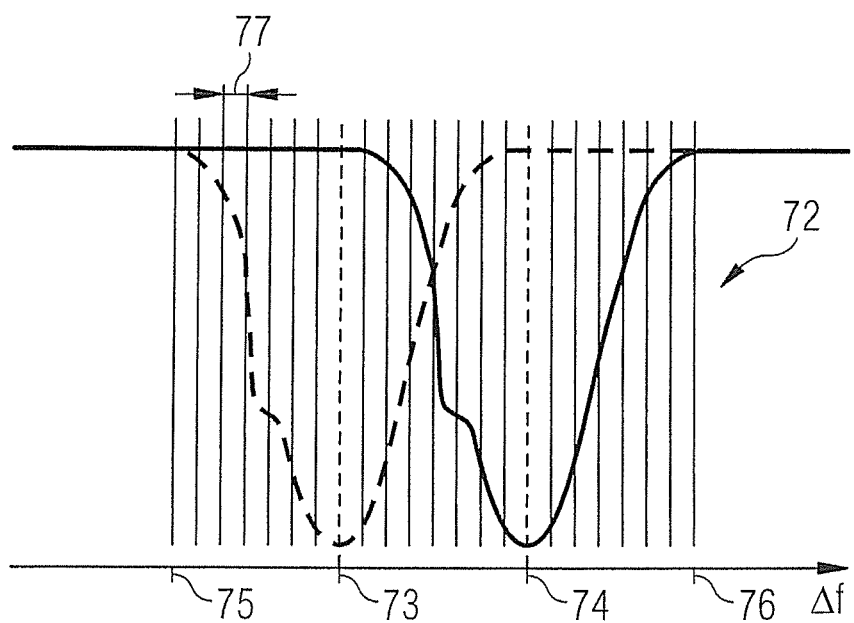
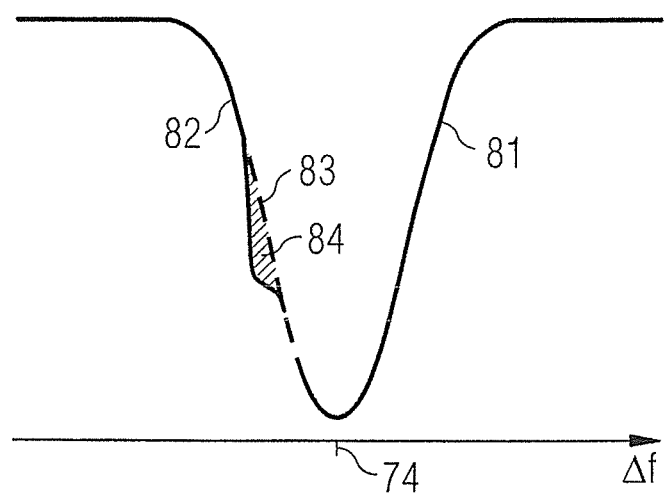

METHOD AND DEVICE FOR MAGNETIC RESONANCE IMAGING

BACKGROUND OF THE INVENTION

1. Field of the Invention

The invention concerns the field of magnetic resonance (MR) imaging. In particular, the invention concerns methods and devices for MR imaging in which a magnetization of an examination subject is specifically prepared.

2. Description of the Prior Art

MR techniques have become widespread over time and have numerous applications in medical technology. In one class of methods for MR imaging, the magnetization of hydrogen nuclei spins is globally or locally affected in order to subsequently acquire MR data with a readout sequence. Examples of such methods contain the targeted saturation of hydrogen nuclei spins of free water to increase contrast.

A technique known as CEST (Chemical Exchange-dependent Saturation Transfer) imaging is a relatively recent method for MR imaging. This is described for an exemplary application in W. Ling et al., "Assessment of glycosaminoglycan concentration in vivo by chemical exchange-dependent saturation transfer (gagCEST)", Proc Natl Acad Sci USA 2008; 105(7):2266-2270. In general, in CEST imaging a magnetization of hydrogen nuclei spins is generated from molecules or molecule groups selected depending on the application, the hydrogen atoms of which are transferred to water molecules via chemical exchange with said water molecules. For preparation of the magnetization, alternating magnetic fields can be used whose frequency corresponds essentially to the resonance frequency of the hydrogen nuclei spins in the selected molecules and has a frequency shift relative to resonance frequency of the hydrogen nuclei spins of free water. A readout sequence can subsequently be implemented with which the magnetization of hydrogen nuclei spins in water molecules is read out. Via the chemical exchange, the prepared magnetization of the nuclear spins of the molecules of interest is transferred to water and can be detected using the acquired MR data. CEST imaging can be used for different purposes, for example to depict cartilage damage, to determine the pH value of tissue, for spatially resolved depiction of protein concentrations in the brain (the —NH groups of which protein concentrations can be detected with CEST imaging) or for in vivo imaging of gene expression.

For example, in CEST methods MR data can be repeatedly, sequentially acquired, wherein the examination subject is respectively exposed to an alternating field with a frequency to prepare the magnetization. This process is repeated for alternating fields with different frequencies. For example, in the article by W. Ling et al. cited in the preceding alternating fields with two frequencies are used that are symmetrical to the resonance frequency of hydrogen nuclei spins in free water. Deviations of the basic magnetic field from a known field strength (that, for example, can be caused by an inhomogeneity of the basic field) can lead to the situation that the quality of the image data determined with the CEST imaging is reduced. In the extreme case, for example, basic field inhomogeneities can lead to the situation that the frequency of the alternating fields is so far removed from the actual possible, locally varying resonance frequency of the hydrogen nuclei spins that reasonable conclusions with regard to the presence or absence of the molecules that should be depicted with spatial resolution can no longer be drawn from the acquired MR data.

SUMMARY OF THE INVENTION

An object of the invention is to provide a method and a device that allow CEST imaging with higher quality. In particular, an object of the invention is to provide such methods and devices that have a high degree of robustness with regard to an inhomogeneity of the basic field. A further object of the invention is to provide such methods and devices in which the greater robustness with regard to magnetic field inhomogeneities can be achieved via measures that can be implemented within time periods that are acceptable for an in vivo imaging.

These objects are achieved in accordance with the invention by a method is specified for magnetic resonance (MR) imaging of an examination subject, in particular for CEST imaging wherein an acquisition of MR data takes place with examination subject exposed to an alternating field to prepare a magnetization of nuclear spins in the subject, and with a readout sequence for a number of picture elements of the examination subject, respective signal values associated with the picture elements are determined. The acquisition of the MR data is implemented for multiple alternating fields for the preparation of the magnetization with different frequencies, such that for each picture element multiple signal values are obtained that are associated with different frequencies of the alternating field for the preparation of the magnetization. The method furthermore includes an evaluation of the acquired MR data, wherein the evaluation is respectively implemented for each picture element depending on the signal values that were determined after the preparation of the magnetization with alternating fields of different frequency. In the method, magnetic field data are determined that include spatially resolved information about a basic magnetic field for the picture elements. The acquisition of the MR data and/or the evaluation of the acquired MR data is implemented depending on the magnetic field data.

As is typical, the static magnetic field of an MR device that is generated for MR imaging (and that is frequently also designated as a B0 field) is designated as a basic field. The readout sequence can be a 2D or 3D readout sequence. A picture element can accordingly correspond to a 2D pixel or a 3D voxel of the examination subject.

In the method the magnetic field data with the information about the basic magnetic field strength are used in order to implement the MR data acquisition and/or the evaluation of the MR data. For example, basic field inhomogeneities can be taken into account in the planning of the MR data acquisition and/or the evaluation of the acquired MR data. The robustness can thus be increased with regard to magnetic field inhomogeneities. By the use of the magnetic field data a targeted influencing of the MR data acquisition and/or of the evaluation can take place such that the method can be used for in vivo imaging.

The implementation of multiple MR data acquisitions for respective different frequencies of the alternating field for preparation of the magnetization allows the distribution of molecules that are different than water to be determined with spatial resolution, for example in a CEST imaging.

Before the acquisition of the MR data the basic magnetic field strength can be defined with spatial resolution to determine the magnetic field data. The basic magnetic field strength can be determined so that an associated basic field strength is determined for each pixel at least for the segment of the examination subject or the measurement volume to be determined. For this purpose the distribution of the basic field strength at the examination subject can be determined in a separate step. The determination of the basic field strength before the acquisition of the MR data allows the implementation of the actual data acquisition to be planned and controlled depending on this information.

In the method the frequencies of the alternating fields that are used to prepare the magnetization are established depending on the magnetic field data. The frequencies can be selected so that the preparation of the magnetization takes place selectively with those frequencies with which a portion of the absorption spectrum is scanned at which the absorption minima of interest are to be found.

In embodiments the frequencies of two alternating fields can be established so that they are situated symmetrically relative to a characteristic resonance frequency of the hydrogen nuclear spins of water molecules in a region of interest of the examination subject. In embodiments the MR data acquisition can respectively be implemented for a preparation of the magnetization using precisely two frequencies.

A number and/or a frequency interval of the frequencies of the alternating fields can be established depending on the magnetic field data. Alternatively or additionally, a minimum and/or a maximum of the frequencies of the alternating fields can be established depending on the magnetic field data. The number of MR data acquisitions can thereby be optimized with regard to known distribution of the basic field strengths. In particular, the number of MR data acquisitions that deliver a small information content due to too large a frequency shift relative to the portion of the absorption spectrum that is of interest can be reduced.

The frequencies of the alternating fields for preparation of the magnetization can be selected depending on a minimum basic field strength and a maximum basic field strength in a segment of the examination subject that is to be examined. The frequencies of the alternating fields for preparation of the magnetization can also be selected depending on a strength of the basic magnetic field that is averaged over the segment of the examination subject that is to be examined.

The MR data acquisition can be implemented for alternating fields with more than two different frequencies. In this way signal values can be determined as a function of the frequency of the alternating fields for preparation of the magnetization with higher frequency resolution.

The basic magnetic field strength can be determined with spatial resolution before the acquisition of the MR data in a shimming procedure. This information is thus provided for a subsequent imaging, in particular CEST imaging, without additional measurement time having to be used to determine the curve of the basic field strength.

Alternatively or additionally, to determine the basic field strength before the acquisition of the MR data the basic magnetic field strength can be determined in a temporally overlapping manner—in particular in parallel—with the acquisition of the MR data. In this way the spatially resolved basic field strength can be determined at the point in time of the MR data acquisition and be used in the evaluation of the MR data.

The basic magnetic field strength can be determined in a temporally overlapping manner, but independent of the acquired signal values. It should be noted that a determination of the basic field strengths that is independent of the determination of the signal values for the pixels can take place using the same readout sequence that is also used for MR data acquisition. The spatially resolved determination of the basic field strength can thus be implemented upon acquisition of the MR data, but independent of the signal values determined for the pixels. An "independent determination" means that, although the signal values for the different pixels and the basic magnetic field strength are determined with the same readout sequence, for example, measurement values that are different and independent of one another are acquired from precessing nuclear spins upon readout of generated signals.

In the readout sequence a first and second echo signal can be acquired. The signal values for the pixels can be determined via reverse transformation of the signal amplitudes of the first or possibly second echo signal in positional space. Phase shifts between a first image acquired from the first echo signal and a second image acquired from the second echo signal can be determined to determine the basic magnetic field strength. In this way the information about the basic field strengths is provided as real, independent information with which the quality of the imaging can be increased in the evaluation of the MR data.

The evaluation of the acquired MR data can be implemented depending on the magnetic field data. In particular, the information about the basic field strength that is determined in the MR data acquisition, which information specifies the basic field strength at the point in time of the data acquisition, can thereby be used to evaluate the MR data. For example, this information can be used in order to determine the resonance frequency of hydrogen nuclei spins of free water with spatial resolution at the point in time of the MR data acquisition.

The resonance frequency of hydrogen nuclei spins in water molecules can respectively be determined for the number of picture elements depending on the magnetic field data. The acquisition of the MR data and/or the evaluation of the acquired MR data can be implemented depending on the resonance frequencies determined for the plurality of pixels. For example, signal values that are determined after a preparation of the magnetization by alternating fields with frequencies above and below the resonance frequency can be compared for each pixel depending on the respective determined resonance frequency of hydrogen nuclei spins in water molecules. A difference can be determined between signal values that are associated with frequencies above and below the resonance frequency of hydrogen nuclei spins in water molecules at the corresponding picture element. The signal values can be determined directly from the MR data. One of the signal values can also be determined by fitting an absorption curve to signal values determined from the MR data. Such differences quantify the CEST effect. Alternatively, the CEST effect can also be quantified in that differences between signal values are totaled up or integrated given frequencies symmetrically situated relative to the resonance frequency of hydrogen nuclei spins of water molecules.

The acquisition of the MR data can be implemented for multiple alternating fields to prepare the magnetization, whose frequency is respectively different from the resonance frequency of hydrogen nuclei spins in water molecules. The frequency of at least one alternating field can be established so that it induces a saturation of hydrogen nuclei spins in molecules or molecule groups that are different than water molecules, the magnetization of which can be transferred to water via chemical exchange. In this way information about the density of the molecules or molecule groups that are different than water can be obtained even with a low number of MR data acquisitions, for example with two MR data acquisitions.

A signal value can respectively be compared with an additional signal value to evaluate the MR data for the number of picture elements. The signal value is associated with the frequency of the alternating field with which the saturation of the hydrogen nuclei spins in the molecules or molecule groups different than water is achieved. Given an additional frequency the additional signal value can be determined directly from the MR data or by fitting an absorption curve to signal values determined from measurements.

A difference can be determined between the signal value that is associated with a frequency and an additional signal value that is associated with an additional frequency. The frequency and the additional frequency can have frequency shifts with different algebraic sign and essentially the same magnitude relative to a resonance frequency of hydrogen nuclei spins in water molecules at the corresponding pixel.

The invention also encompasses a non-transitory, computer-readable storage medium encoded with a command sequence that, upon execution by a control system of an MR device, causes the MR device to implement the method according to one aspect or exemplary embodiment of the invention. The command sequence can be loaded into the memory of a control and evaluation computer of an MR device. The sequence can be source code or can be a compiled command sequence. Via the command sequence the device can be configured in terms of programming to implement the method. The storage medium on which the command sequence is stored can be, for example, a CD-ROM, a DVD, a magnetic tape, a flash memory, a USB stick or another non-transitory data medium on which a computer program is stored as electronically readable control information.

The invention also encompasses a device for magnetic resonance (MR) imaging of an examination subject, in particular for implementation of a CEST imaging. The device has a basic field magnet to generate a basic magnetic field; a device to generate an alternating magnetic field to prepare a magnetization; and an acquisition device to acquire MR data during a readout sequence. The device furthermore has a computer that is configured to control the device to generate the alternating magnetic field such that said device sequentially generates multiple alternating fields with different frequencies. The computer is furthermore configured to evaluate the acquired MR data, wherein it determines an associated image datum for a number of picture elements of the examination subject, respectively dependent on signal values that were determined after the preparation of the magnetization with the different frequencies of the alternating field. The computer is configured to implement the control of the coil arrangement and/or the evaluation of the acquired MR data depending on magnetic field data that comprise spatially resolved information about the basic magnetic field for the picture elements.

As explained with reference to the method, the robustness with regard to magnetic field inhomogeneities is increased with the device. A targeted influencing of the MR data acquisition and/or of the evaluation can take place via the use of the magnetic field data such that the method is usable for in vivo imaging.

The device can be configured to implement the method according to any of the above-described embodiments.

Embodiments of the invention are usable in MR imaging, in which the examination subject is exposed to alternating fields with different frequency for the preparation of the magnetization, for example in CEST imaging.

BRIEF DESCRIPTION OF THE DRAWINGS

FIG. 2 is a schematic representation of a pulse sequence for the explanation of methods and devices according to exemplary embodiments.

FIG. 3 is a schematic representation of signal values acquired for pixels for the explanation of the method according to one exemplary embodiment.

FIG. 4 is a schematic representation of acquired signal values for the explanation of corruptions due to basic field inhomogeneities.

FIG. 5 is a flowchart of a method according to an exemplary embodiment.

FIG. 6 is a flowchart of a method according to a further exemplary embodiment.

FIG. 7 is a flowchart of a method according to a further exemplary embodiment.

FIG. 8 is a schematic depiction of signal values acquired for a pixel to explain the method according to one exemplary embodiment.

FIG. 9 is a schematic depiction of a frequency scan and of signal values acquired for a pixel to explain the method according to a further exemplary embodiment.

FIG. 10 is a schematic depiction of the signal values from FIG. 9.

DESCRIPTION OF THE PREFERRED EMBODIMENTS

The features of the exemplary embodiments described in the following can be combined with one another insofar as it is not explicitly stated otherwise.

Figure 1:
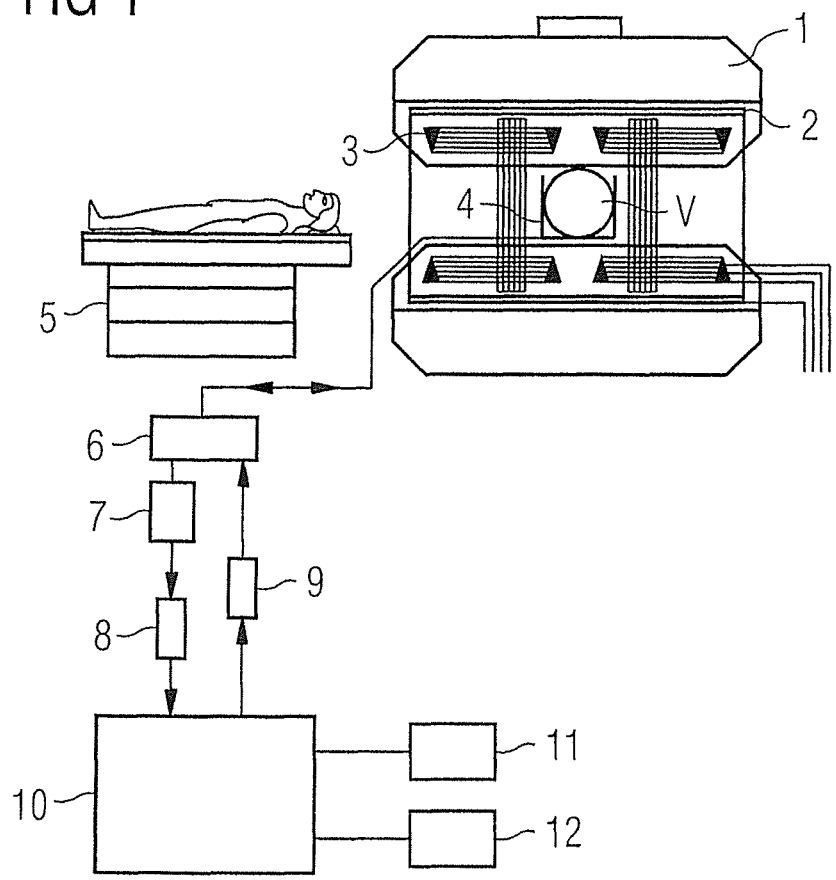
FIG. 1 is a schematic depiction of a device for magnetic resonance (MR) imaging according to one exemplary embodiment.

FIG. 1 is a schematic depiction of a magnetic resonance (MR) device to generate an MR image of an examination subject according to one exemplary embodiment. The basic design of the MR device is based on the design of a conventional tomography apparatus. A basic field magnet 1 generates a temporally constant basic field for polarization or, respectively, alignment of the nuclear spins in an examination region of a subject, for example of a portion of a human body that is to be examined. A relatively high homogeneity of the basic field that is desired for MR data acquisition is achieved at least approximately in a measurement volume V in which the parts of the examination subject to be examined can be positioned in the MR data acquisition. Shim plates made of ferromagnetic material can be attached at a suitable point to increase the homogeneity. Shim coils 2 that are activated by a shim power current are additionally provided.

A gradient coil system 3 is provided that is supplied with current to generate gradient fields in a readout process with monitoring of a system computer 10.

An antenna 4 that is typically designed as a radio-frequency (RF) antenna can be used in the readout sequence in order to generate a pulse to tilt the nuclear spins and in order to detect the magnetic moment of the precessing nuclear spins. Separate transmission and reception antennas can also be provided. The antenna 4 converts a radio-frequency pulse emitted by an RF power amplifier into an alternating magnetic field for the excitation of the nuclear spins of the examination subject. The antenna 4 can comprise one or more transmission coils and one or more reception coils. Switching between transmission operation and reception operation can take place via a transmission/reception diplexer 6. The alternating field emanating from the precessing nuclear spins—i.e. the nuclear spin echo signals caused by a pulse sequence from one or more radio-frequency pulses and on or more gradient pulses, for example—is converted by the reception coils into a voltage that is supplied via an amplifier 7 to an acquisition channel 8. Furthermore, a transmission channel 9 is provided with which RF pulses are generated for the excitation of the nuclear magnetic resonance and to prepare the magnetization. The respective radio-frequency pulses are thereby generated with monitoring by a system computer 10. For example, the frequency and the envelope of an RF signal can be established by the system computer 10, which RF signal should be generated by the antenna 4 to prepare the magnetization, or in a readout sequence. Suitable components are provided, for example in order to modulate an RF carrier signal to an envelope in the transmission channel 9, the frequency of which carrier signal is predetermined by the system computer 10.

As will be described in detail with reference to FIG. 2-11, the MR device is designed so that the antenna 4 radiates an alternating field with a desired frequency towards the examination subject, which examination subject is positioned in the measurement volume V by movement of a table 5. MR data are acquired in readout sequences. For example, for this the signals acquired by the RF antenna 4 are demodulated in a phase-sensitive manner in the acquisition channel 8. A signal value for each pixel is determined by the system computer 10 from the data acquired in such a manner. For example, the antenna 4 can detect amplitudes of an echo signal from which the system computer 10 can respectively determine a signal value via reverse transformation of pulse space into positional space for multiple pixels of the examination subject. The data acquisition can thereby be a 2D or 3D acquisition. A picture element can accordingly correspond to a pixel or a voxel of the examination subject. The signal value in this case corresponds to the value of a picture element of an MR image.

This MR data acquisition with preparation of the magnetization is implemented repeatedly, wherein given sequential MR data acquisitions the examination subject is exposed to multiple alternating fields emitted with different frequencies by the antenna 4. In this way multiple signal values that correspond to different frequencies of the alternating field that the RF antenna 4 emits to prepare the magnetization can be determined for each of the picture elements. Image data can be generated by evaluating these different signal values. As is described in more detail, image data that represent the distribution of specific molecules or molecule groups in the segment of the examination subject that is to be examined can be generated, for example via suitable selection of the frequencies of the alternating fields or via suitable evaluation of the signal values acquired as a function of different preparation frequencies.

The device according to exemplary embodiments of the invention is designed so that the system computer 10 implements the process of the MR data acquisition and/or the evaluation of the acquired MR data depending on spatially-resolved information about the strength of the basic magnetic field that is generated by the basic field coil 1. The system computer 10 can establish the frequencies of the alternating fields (that are emitted by the RF antenna 4 to prepare the magnetization) depending on the spatially resolved basic magnetic field strength. The system computer 10 can also use the information about the basic magnetic field strength in order to determine the resonance frequency of hydrogen nuclei spins in water molecules with spatial resolution. The system computer 10 can draw upon the resonance frequency that is determined in this manner in order to evaluate the signal values that are determined for the different preparation frequencies.

The spatially resolved information about the basic magnetic field strength can be determined in different ways by the MR device. In one embodiment, the basic magnetic field strength is determined with spatial resolution before implementation of the actual MR data acquisition. In one embodiment, the basic magnetic field strength is determined with spatial resolution during a shimming of the MR device in which the currents are adjusted by the shim coils 2. Alternatively or additionally, the basic magnetic field strength can also be determined in the MR data acquisition. In the latter case, the determination of the basic magnetic field strength advantageously takes place such that the curve of the basic field strength is determined independent of the signal values that are determined from the MR data acquisition for the different pixels.

The device can have additional devices, for example an optical output device 11 to output the image data and a user interface 12 via which a user can output control commands to the system computer 10.

The representation of the device in FIG. 1 is schematic. For example, the system computer 10 can be fashioned by multiple separate processors or computers, of which one implements control and monitoring function and another implements evaluation functions.

FIG. 2 is a schematic representation 20 for further explanation of the method implemented by the device from FIG. 1. FIG. 2 schematically shows different steps for a CEST measurement that are implemented in a chronological order.

At 21 a first pulse is generated to prepare a magnetization, the envelope of which pulse is shown. The examination subject is thereby exposed to a first alternating magnetic field with a first frequency.

A readout sequence is applied at 22. The readout sequence can be a sequence for a 2D or 3D MR data acquisition. Different known readout techniques can be used. For example, an echo method can be used in which, with an alternating magnetic pulse 23 generated by an antenna, spins from one orientation are tilted parallel to the basic field and suitable gradient fields 24 are switched. One or more lines in k-space are read out with the readout sequence 22. The readout sequence 22, and possibly the preparation of the magnetization with the pulse 21 that has the first frequency, can thus be repeated often until all lines in k-space have been scanned.

MR data that initially deliver a k-space presentation of a 2D or 3D segment of the examination subject can be acquired with the preparation of the magnetization at 21 with a pulse with the first frequency and the readout sequence 22. A transformation into positional space can take place in a conventional manner. Given the MR data acquired in such a manner in positional space, a signal value is associated with each picture element. This signal value presently corresponds to the value of a pixel or voxel in positional space that is obtained after preparation of the magnetization with the first frequency at 21 from the readout sequence 22.

Depending on the frequency of the pulse 23, the magnetization of hydrogen nuclei spins of water molecules can be determined with the readout sequence, for example. This can be influenced by the preparation of the magnetization at 21. In particular—as explained in the preceding—a saturation of hydrogen nuclei spins of molecules or molecule groups that are different than water but whose nuclear spin magnetization is transferred to water molecules via chemical exchange can take place in the preparation of the magnetization.

The MR data acquisition with preparation of the magnetization and readout sequence is implemented repeatedly. Alternating fields with various different frequencies are thereby used to prepare the magnetization.

At 25 a second pulse—whose envelope is shown—is generated for the preparation of the magnetization. The examination subject is thereby exposed to a second alternating magnetic field with a second frequency. At 26 the readout sequence is implemented again.

In this way multiple sets of MR data can be acquired that represent a segment of the examination subject to be examined, respectively after the preparation of the magnetization. The signal values that are associated with a pixel or voxel in the different sets of MR data can be combined in a suitable manner, as is described in detail with reference to FIG. 3-11.

According to exemplary embodiments of the invention, magnetic field data that have spatially resolved information about the basic magnetic field strength for the different pixels are used in the acquisition or evaluation of the MR data. In exemplary embodiments, the information about the curve of the basic field strength can be used in order to establish the frequencies of the alternating fields at 21 and 25. Alternatively or additionally, the information about the basic field strength can be used after the data acquisition in order to determine, picture element-by-picture element, the position of the frequencies used to prepare the magnetization relative to a resonance frequency of hydrogen nuclei spins in water molecules.

FIG. 3 is a schematic depiction for further explanation of methods and devices according to exemplary embodiments.

Acquired signal values and their evaluation for a first element 30 and a second picture element 31. To prepare the magnetization, pulses are used with a frequency that is frequency-shifted relative to the resonance frequency of hydrogen nuclei spins of free water molecules, by $\Delta f_1$ in a first MR data acquisition and by $\Delta f_2$ in a second MR data acquisition. The frequencies are thereby selected so that $\Delta f_1 \approx -\Delta f_2$ and optimally $\Delta f_1 = -\Delta f_2$, meaning that the two frequencies are essentially symmetrical to the resonance frequency of hydrogen nuclei spins of free water molecules. Signal values for the first pixel that are obtained from the MR data acquisition are shown at 34 and 35. The position of the frequencies that were used in the determination of the signal values 34 and 35 can be obtained relative to the resonance frequency of hydrogen nuclei spins of free water molecules, depending on the spatially resolved information about the basic field strength.

At the first pixel, the examination subject has molecules or molecule groups that are different than water molecules and whose hydrogen atoms are subject to a chemical exchange with water molecules. The segment 33 of the curve that shows the signal value (obtained from MR) for the first picture element 30 as a function of the frequency of the alternating field to prepare the magnetization has a local absorption minimum that is superimposed on the absorption curve of free water. This structure has the effect that the segments 32 and 33 of the absorption curve are not mirror-symmetrical. For example, this structure can result from the fact that—given preparation of the magnetization with the alternating field with the frequency shift $\Delta f_1$—a saturation of the nuclear spins in the water molecules of different molecules takes place, wherein the magnetization is transferred to hydrogen nuclei spins of free water before implementation of the readout sequence can be dephased and thus can no longer be acquired in the detection. A local minimum accordingly results in the curve at $\Delta f_1$ that shows the signal value as a function of the preparation frequency.

From a comparison of the signal value $S_1$ at 34 (acquired in the preparation given magnetization with the frequency shift $\Delta f_1$) and of the signal value $S_2$ acquired for $\Delta f_2$), the number or density of the molecules can be concluded, which leads to the decrease of the measured magnetization in the curve segment 33 relative to the curve segment 32. Possible measurements to quantify the CEST effect are proportional to the difference $S(\Delta f_2) - S(\Delta f_1 = -\Delta f_2)$. For example, $[S(\Delta f_1 = -\Delta f_2) - S(\Delta f_2)]/S(\Delta f_1 = -\Delta f_2)$ or $[S(\Delta f_1 = -\Delta f_2) - S(\Delta f_2)]/S(\Delta f = 0)$ can be set as a value of a voxel or pixel of a CEST image.

At the second picture element for which the signal values shown at 31 are acquired, the examination subject predominantly has hydrogen nuclei spins in water molecules. The segments 32 and 34 of the curve that represents the signal value determined from the MR data at the pixel as a function of the preparation frequency are mirror-symmetrical. Accordingly, the signal values 37, 36 for the second pixel that are determined from the MR data are identical: $S_1 = S_2$.

FIG. 4 illustrates the robustness relative to an inhomogeneity of the basic magnetic field can be increased by taking into account the curve of the basic field. Shown at 38 in FIG. 4 is a resonance frequency of hydrogen nuclei spins of free water for whose determination magnetic field inhomogeneities are ignored. A spatially dependent variation of the basic field strength leads to a shift of this resonance frequency at 39. The shift of the absorption curve from the expected position (shown as a broken line) to the actual position (shown with solid lines) can lead to adulterations in the evaluation. If pulse frequencies that are situated symmetrically relative to the frequency expected while ignoring the basic field inhomogeneities are used to prepare the magnetization, the shift of the absorption curve leads to the situation that different signal values $S_1$ at 34 and $S_2$ at 35 are determined. These values are different although the absorption curve is mirror-symmetrical relative to the actual resonance frequency of hydrogen nuclei spins of free water, such that an ultimate CEST effect can incorrectly be concluded.

Given methods and devices according to exemplary embodiments of the invention, information about spatial variations of the basic magnetic field strength is used to plan the MR data acquisition and/or in the evaluation. Different exemplary embodiments are described in closer detail with reference to FIG. 5-11. The information about spatial variations of the basic magnetic field strength can be obtained before the MR data acquisition and/or in the MR data acquisition.

FIG. 5 is a flow diagram representation of a method 40 according to one exemplary embodiment. In the method a curve of the basic field strength is determined before the actual MR data acquisition.

At 41 a curve of the basic magnetic field strength is determined. A corresponding value of the basic field strength is thereby determined for a plurality of pixels of the examination subject. The determination of the basic field strength can be implemented in a separate step and before implementation of the MR data acquisitions with preparation of the magnetization.

In one embodiment, the determination of the basic field strength at 41 can also be implemented during a shimming procedure. In this procedure amperages for shim coils can be established. For this purpose, currents can be iteratively adjusted frequently, and the resulting curve of the basic field strength is determined in order to check the compliance with homogeneity requirements. The curve of the basic field strength that is determined last in the shimming can be used as information about the basic field strength in the methods and devices according to exemplary embodiments.

At 42 the different frequencies $f_i$ of the alternating fields for preparation of the magnetization are established depending on the determined curve of the basic field strength. The establishment of the frequencies at 42 can comprise that a number of frequencies $f_i$ is established. Alternatively or additionally, a frequency interval can be established between the frequencies $f_i$. Alternatively or additionally, a minimum and maximum of the frequencies $f_i$ can be established. In the establishment of the frequencies at 42, the curve of the basic field strength across multiple pixels or voxels can be taken into account, for example the curve of the basic field strength in a complete segment of the examination subject that is to be examined or in an entire measurement volume of the MR device.

At 43-46 multiple MR data acquisitions are implemented, wherein the preparation of the magnetization respectively takes place with an alternating field that has one of the frequencies $f_i$.

At 43 the magnetization is prepared using an alternating magnetic field with the frequency $f_i$. This field can be generated by the RF transmission antenna of the MR device.

At 44 a readout sequence is implemented in which one or more lines in k-space are read out, for example. The readout sequence, and typically the preparation of the magnetization as well, can be repeated often for the frequency $f_i$ until k-space has been scanned. For picture elements of the examination subject, respective associated signal values in positional space can be determined for picture elements of the examination subject from the signals acquired in the readout sequence, for example via Fourier transformation of the k-space data into positional space.

At 45 it is checked whether the MR data acquisition was implemented for all established frequencies for preparation of the magnetization. In the event that there are additional frequencies, at 46 the index i is incremented and the method returns to 43.

In the event that the MR data acquisition was implemented for all established frequencies for preparation of the magnetization, the additional evaluation of the acquired MR data takes place at 47. The evaluation for each picture element can thereby take place depending on the signal values $S_i$ that were acquired for the frequencies $f_i$. For example, an absorption curve similar to the absorption curves shown in FIG. 3 can be determined and evaluated per pixel from the signal values $S_i$. For this purpose, an interpolation can take place between the signal values $S_i$ obtained via measurement.

Various techniques for the evaluation of the acquired data can be used in CEST imaging. For example, the variable $[S(-\Delta f)-S(\Delta f)]$, the variable $[S(-\Delta f)-S(\Delta f)]/S(-\Delta f)$ or the variable $[S(-\Delta f)-S(\Delta f)]/S(0)$ can be determined for each pixel for quantification of the CEST effect. $S(\Delta f)$ is the signal value of the picture element as a function of the frequency used to prepare the magnetization, measured relative to the resonance frequency of hydrogen nuclei spins of free water. The curve of the basic field strength determined at 41 can be used to determine the resonance frequency for free water. This information can thus also be used in the evaluation at 47.

The cited variables $[S(-\Delta f)-S(\Delta f)]$ or $[S(-\Delta f)-S(\Delta f)]/S(-\Delta f)$ can be evaluated at a predetermined frequency shift $\Delta f_M$ that lies in the absorption curve of the hydrogen nuclei spins of a specific molecule or of a specific molecule group for which a chemical exchange can take place. In further embodiments, $[S(-\Delta f)-S(\Delta f)]$ can be totaled up or integrated over multiple frequency shifts $\Delta f$. The values acquired in such a manner for the various pixels can be graphically output or stored for further use. The information generated in the evaluation at 47 are thus generated from the data that were acquired via MR data acquisition with preparation of the magnetization with different frequencies.

FIG. 6 is a flow diagram depiction of a method 48 according to one exemplary embodiment. Steps that correspond to steps of the method 40 are designated with the same reference characters. In the method 48 a curve of the basic field strength is determined both before the actual MR data acquisition and in the MR data acquisition.

To determine the curve of the basic field strength, MR data are determined with a readout sequence after the preparation of the magnetization at 43. Therefore the curve of the basic field strength is determined at 49 in a temporally overlapping manner. While Steps 44 and 49 are shown as separate steps for clarity, information about the curve of the basic field strength can advantageously likewise be obtained with the readout sequence.

The curve of the basic field strength at 49 can advantageously be determined so that the information about the basic field strength are not derived from the signal values in positional space but rather are defined independent of this. For example, for this not only can a magnetization echo be detected in the readout sequence; rather, two echoes can be detected. The signal values for pixels in positional space can be acquired via Fourier transformation of the amplitudes of the first echo into positional space. Information about the curve of the basic field can be determined from phase shifts between a first image acquired from the first echo signal and a second image acquired from the second echo signal.

The information about the basic field strength that is determined in the acquisition of the MR data can in particular be used in the evaluation at 47.

While the basic field strength is determined both before the MR data acquisition and during the MR data acquisition in the method from FIG. 6, in further embodiments the basic field strength can also be determined with the spatial resolution only during the data acquisition. The basic field strength can then be used in the evaluation of the MR data, for example. For this the determination of the curve of the basic field strength is omitted in the method from FIG. 6. The frequencies $f_i$ are established at 42 according to predetermined values that can depend on a desired or average value of the basic field strength. The establishment of the frequencies $f_i$ at 42 in this case takes place independent of the curve of the basic field strength. The curve of the basic field strength determined at Step 49 is used in the evaluation at 47.

How the information about the curve of the basic field can be used in the MR data acquisition or evaluation in different exemplary embodiments is described in detail with reference to FIG. 7-11. The information about the curve of the basic field strength can thereby be acquired before and/or during the MR data acquisition, as was described with reference to FIGS. 5 and 6.

FIG. 7 is a flow diagram depiction of a method 50 according to one exemplary embodiment. The method uses information about the basic field strength B0 for a plurality of voxels of the examination subject. Coordinate triplets of voxels are designated with (x, y, z).

The frequencies of the alternating field for preparation of the magnetization depending on the spatially resolved information about the basic field strength B0 are established at 51. The frequencies can be established depending on the minimum and maximum of B0 in a segment of the examination subject that is to be examined. The frequencies can also be established depending on a value of the basic field strength that is averaged over the segment to be examined. In both cases, not only the local value of the basic field strength at a specific voxel but also the curve of the basic field strength across multiple voxels are thus taken into account to establish the frequencies. The frequencies can furthermore be established depending on a characteristic width of the absorption curve of hydrogen nuclei spins in free water molecules and/or of hydrogen nuclei spins in another molecule whose density should be determined with spatial resolution.

Multiple MR data acquisitions are conducted at 52 in order to respectively acquire MR data after the preparation of the magnetization with an alternating field that has one of the frequencies $f_i$.

The signal values $S_i$ that were acquired from the MR data for the voxels in positional space are further evaluated at 53-56. The evaluation likewise takes place depending on information about the curve of the basic field strength. One of the voxels of the examination subject is selected at 53.

A characteristic resonance frequency—for example the resonance frequency of hydrogen nuclei spins in free water—is determined at 54. The information about the basic field strength at the voxel (x, y, z) is used for this. In the event that the curve of the basic field strength was also determined in the MR data acquisition, the characteristic resonance frequency can be determined at 54 depending on these data in order to reduce the influence of time change of the basic field strength. Since spatially resolved information about the basic field strength is provided, the resonance frequency that corresponds to the minimum of the absorption curve S(f) can also be determined specifically for the corresponding voxel.

An image datum for the corresponding voxel—for example for a CEST image—is determined at 55 depending on the set of signal values $S_i$ for the corresponding voxel and depending on the characteristic resonance frequency determined at 54. The frequency determined at 54 can in particular be used in order to determine the position of the minimum of the absorption curve. It is not necessary to determine the position of the minimum of the absorption curve depending exclusively on the signal values $S_i$, for which a relatively large number of frequency values $f_i$ must typically be scanned. The number of frequencies of the alternating field for preparation of the magnetization for which an MR data acquisition takes place can thereby be reduced.

At 56 it is checked whether an evaluation should be implemented for an additional voxel. In the event that signal values for additional voxels are provided and should be evaluated, an additional voxel is selected at 53 and Steps 54-56 are implemented again.

The image data determined for the different voxels at 55 can be graphically output or stored at 57.

Even if the method 50 were described as an example in the context of a 3D imaging, it can similarly be applied to a 2D imaging.

The use of information about the basic field strength in the data acquisition and evaluation is explained further with reference to FIG. 8-11.

Using FIG. 8 a method is explained in detail in which the MR data acquisition is implemented with precisely two different frequencies for alternating fields.

Based on information about the strength of the basic field, two frequencies are initially established for the alternating fields for preparation of the magnetization. The strength of the basic field is averaged over the segment of the examination subject that is to be examined. The resonance frequency of hydrogen nuclei spins of water that is associated with the averaged basic field strength is determined. This resonance frequency is shown at 61 in the presentation 60. Frequencies 62 and 63 of the alternating fields with which the magnetization is prepared are established so that, relative to the resonance frequency 61, they have a frequency shift with the same magnitude but different algebraic sign.

A signal value 64 for a pixel is acquired from the MR data acquisition after preparation of the magnetization with an alternating field of the frequency 62. A signal value 65 for a pixel is obtained from the MR data acquisition after preparation of the magnetization with an alternating field of the frequency 63. One of the signal values 64, 65 can be used in order to approximately determine (in a calculation) a branching of the absorption curve, for example the absorption curve for hydrogen nuclei spins of free water. In FIG. 8 this is the branch on which the signal value 65 lies. The position 66 of the actual minimum of the absorption curve for the corresponding pixel is determined from the information about the basic field strength at the corresponding pixel for computational determination of the branch 67. The computational determination of the branch 67 takes place depending at least on the frequency 66 at which the curve has its minimum, and depending on the signal value 65 that is obtained from the MR data acquisition. Additional variables (for example the line width 68 of the absorption curve or the signal value at the minimum) that can frequently be estimated well can be taken into account in the computational determination of the branch 67.

The CEST effect can be determined starting from the computationally determined half 67 of the absorption curve and the signal value 64 that is measured for the frequency 62. For example, for this the computationally determined branch 67 of the absorption curve can be mirrored at a line passing through its minimum at 66, as is shown with a dashed line 67' in depiction 69. A difference 71 between the value 70 of the mirrored branch of the absorption curve at the frequency 62 and the value 64 acquired directly via MR data acquisition can be used as a CEST value for a CEST presentation. Expressed otherwise, the computationally determined branch 67 allows the signal value to be determined at a frequency that, in terms of magnitude, has the same frequency interval from the frequency 66 as the frequency 62 but with opposite algebraic sign. This computationally determined signal value at the branch 67 of the absorption curve is compared with the actual measured signal value 64 on the other branch. The difference 71 quantifies the CEST effect caused by chemical exchange.

Using FIGS. 9 and 10 a method is explained in detail in which the MR data acquisition for alternating fields is implemented with more than two different frequencies. By increasing the number of MR data acquisitions, the absorption curve—i.e. the dependency of the determined signal value on the frequency of the alternating field used for magnetization preparation—can be acquired with higher precision.

Two frequencies for the alternating fields for preparation of the magnetization are initially established based on information about the strength of the basic field. A minimum and maximum of the strength of the basic field are determined for the segment of the examination subject to be examined. As shown in FIG. 9, the absorption curve (shown as a solid line) at the pixel with maximum basic field strength and the absorption curve (shown as a dashed line) at the pixel with minimal basic field strength have a frequency shift.

The frequencies 73 and 74 of the minima of the absorption curves (which, for example, correspond to the resonance frequency of hydrogen nuclei spins of free water) can be determined from the information about the curve of the basic field strength. This allows the frequencies 72 of the alternating fields for which a preparation of the magnetization should be implemented to be determined so that a scanning of all essential segments of the absorption curves is ensured in spite of the inhomogeneity of the magnetic field, without the scanning having to extend to unnecessarily high or low frequencies. By limiting the scanned frequencies to the relevant portion of the spectrum that is determined depending on the known curve of the basic field strength, the time required as a whole for data acquisition can be kept so short that an in vivo imaging is possible.

In particular, the minimum 75 and the maximum 76 of the frequencies 76 can be determined depending on the information about the curve of the basic field strength. The minimum 75 and maximum 76 can be determined depending on both frequencies 73 and 74 that are determined that are determined from the maximum and minimum value of the basic field strength, and depending on a characteristic line width of the absorption curve. The total number of frequencies 72 and/or the frequency interval 77 can also be established depending on the curve of the basic field strength. In the event that the basic field strength in the volume to be examined has only a small variation, a scanning with a small number of frequencies 72 can be sufficient, for example.

A CEST value for the corresponding pixel can be determined for each pixel from the absorption curve determined by testing multiple frequencies. For example, the variable $[S(-\Delta f)-S(\Delta f)]/S(-\Delta f)$ for a frequency shift $\Delta f$ can be determined relative to the minimum of the absorption curve a the corresponding pixel. More complex methods can also be used in order to determine the CEST effect with a high degree of robustness, as is described in detail using FIG. 10.

FIG. 10 is a depiction of an absorption curve with branches 81 and 82. Such an absorption curve can be determined in that MR data acquisitions can be implemented for a larger number of frequencies of the alternating fields to prepare the magnetization. An integral of $[S(-\Delta f)-S(\Delta f)]$ over frequency shifts $\Delta f$ can be calculated as a measure of the CEST effect. This variable corresponds to the area 84 (shown with hatching in FIG. 10) between the branch 82 of the absorption curve and the branch 81 (represented with dashed lines at 83) mirrored at the minimum of the absorption curve at 74.

In the methods and devices according to exemplary embodiments, the position of the minimum of the absorption curve—i.e. the resonance frequency of hydrogen nuclei spins of free water—can be determined from the known curve of the basic field strength. It is not necessary to determine the position of the minimum of the absorption curve from the signal values $S_i$ determined for a pixel from the different MR data acquisitions.

Figure 11:
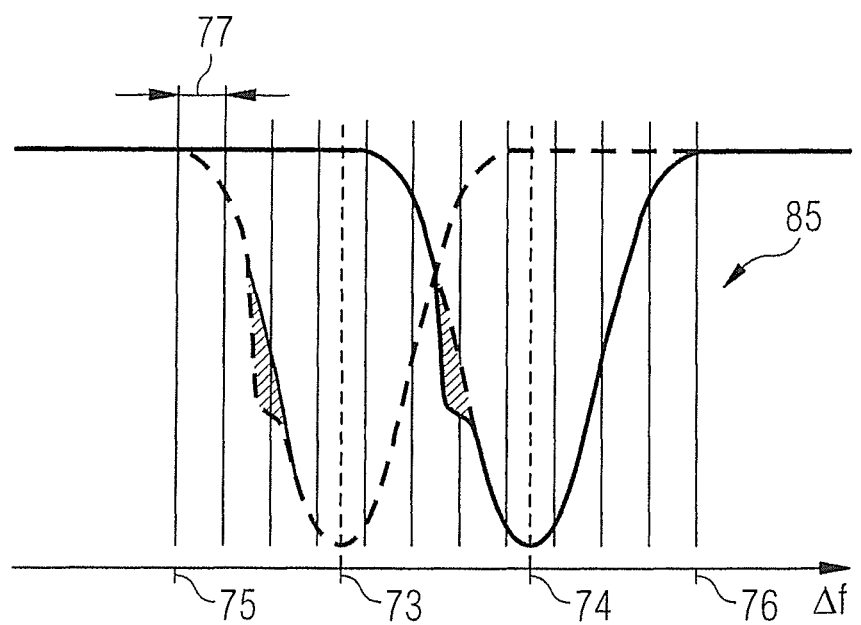
FIG. 11 is a schematic depiction of a frequency scan and of signal values acquired for a pixel to explain the method according to a further exemplary embodiment.

FIG. 11 shows schematic absorption curves, wherein the position of the minimum varies between 73 and 74 due to magnetic field inhomogeneities. For each pixel the position of the minimum of the absorption curve can be determined from the basic field strength at the corresponding pixel. The different frequencies 85 of the alternating fields, and thus the total number of the implemented MR data acquisitions, is established so that the additional structure caused by the CEST effect can be reliably established in a branch of the absorption curve. However, the frequency interval 77 can be selected to be larger in comparison to methods in which the position of the minimum of the absorption curve is determined exclusively from the signal values $S_i$ themselves.

While exemplary embodiments have been described in detail, modifications or developments of the described exemplary embodiments can be realized according to further exemplary embodiments. For example, not only the B0 data but also data about inhomogeneities of additional fields—for example the B1 field—can be taken into account in the implementation of the MR data acquisition and/or evaluation of the MR data. While exemplary embodiments have been described in the context of a 3D imaging, the methods and devices can similarly be used in a 2D MR imaging.

The described methods and devices can be used in an MR imaging in which a magnetization with alternating fields of different frequency is prepared in order to determine, with spatial resolution, the influence of the alternating field on the nuclear spin magnetization for different frequencies of the field used to prepare the magnetization. In particular, methods and devices can be used in CEST imaging.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for acquiring a magnetic resonance image of a subject, comprising the steps of:
   operating a magnetic resonance data acquisition unit with a sequence to acquire magnetic resonance data from an examination subject in the magnetic resonance data acquisition unit, by exposing the subject in said sequence to multiple alternating fields that prepare respective magnetizations, with respectively different frequencies, of nuclear spins in the examination subject, and implementing a readout sequence for signal values from the examination subject comprising magnetic resonance data representing a plurality of pixels of the examination subject;
   in a processor, evaluating said magnetic resonance data pixel-by-pixel dependent on the signal values determined after the preparation of the magnetizations for the different frequencies of the alternating fields;
   in said processor, determining magnetic field data representing spatially resolved information with respect to a basic magnetic field generated in said magnetic resonance data acquisition unit, said spatially resolved information being correlated with said plurality of pixels; and
   implementing at least one of the acquisition of said magnetic resonance data and the evaluation of the acquired magnetic resonance data depending on said magnetic field data.

2. A method as claimed in claim 1 comprising determining said magnetic field data before acquiring said magnetic resonance data, as a spatially resolved determination of a magnetic field strength of said basic magnetic field.

3. A method as claimed in claim 2 comprising establishing the respective frequencies of the multiple alternating fields dependent on said magnetic field data.

4. A method as claimed in claim 2 comprising establishing at least one of a number and a frequency interval of said frequencies dependent on said magnetic field data.

5. A method as claimed in claim 2 comprising establishing at least one of a minimum and a maximum of said respectively different frequencies of said multiple alternating fields dependent on said magnetic field data.

6. A method as claimed in claim 2 comprising determining said magnetic field strength in a shimming procedure implemented before acquisition of said magnetic resonance data.

7. A method as claimed in claim 1 comprising determining a spatially resolved magnetic field strength of said basic magnetic field as said magnetic field data, temporally overlapping with acquisition of said magnetic resonance data.

8. A method as claimed in claim 7 comprising determining said magnetic field strength of said basic magnetic field independently of said signal values.

9. A method as claimed in claim 7 comprising determining a phase shift between a first image obtained from a first echo signal in said readout sequence and a second image obtained from a second echo signal in said readout sequence, and determining a magnetic field strength of said basic magnetic field with spatial resolution from said phase shift.

10. A method as claimed in claim 1 comprising evaluating the acquired magnetic resonance data depending on said magnetic field data.

11. A method as claimed in claim 1 comprising determining a resonance frequency of nuclear spins of hydrogen in water molecules for said plurality of pixels dependent on said magnetic field data, and implementing said at least one of said acquisition of said magnetic resonance data and said evaluation of the acquired magnetic resonance data dependent on said resonance frequency.

12. A method as claimed in claim 1 comprising acquiring the magnetic resonance data for said multiple alternating fields for preparation of magnetization at a frequency respectively different from a resonance frequency of nuclear spins of hydrogen in water molecules.

13. A method as claimed in claim 1 comprising establishing a frequency of at least one of said multiple alternating fields to cause said at least one of said multiple alternating fields to saturate nuclear spins of hydrogen in water molecules, or hydrogen in molecular groups other than water molecules in which nuclear spin is transferred to water by chemical exchange.

14. A method as claimed in claim 13 comprising evaluating said magnetic resonance data for said plurality of pixels by determining a signal value for said one of said alternating fields, and comparing said signal value for said one of said alternating fields with a signal value obtained for another of said alternating fields that has a different frequency.

15. A method as claimed in claim 14 wherein said different frequency exhibits a frequency shift with a different algebraic sign but a substantially equal magnitude to the resonance frequency of the nuclear spin of hydrogen in water molecules.

16. A method as claimed in claim 1 comprising operating said magnetic resonance data acquisition unit with a CEST sequence, as said sequence.

17. A magnetic resonance apparatus for acquiring a magnetic resonance image of a subject, comprising:
 a magnetic resonance data acquisition unit comprising a basic field magnet;
 a control unit configured to operate said magnetic resonance data acquisition unit to acquire magnetic resonance data from an examination subject in the magnetic resonance data acquisition unit, by exposing the subject in said sequence to multiple alternating fields that prepare respective magnetizations, with respectively different frequencies, of nuclear spins in the examination subject, and implementing a readout sequence for signal values from the examination subject comprising magnetic resonance data representing a plurality of pixels of the examination subject;
 an evaluation unit configured to evaluate said magnetic resonance data pixel-by-pixel dependent on the signal values determined after the preparation of the magnetizations for the different frequencies of the alternating fields;
 said evaluation unit also being configured to determine magnetic field data representing spatially resolved information with respect to a basic magnetic field generated in said magnetic resonance data acquisition unit by said basic field magnet, said spatially resolved information being correlated with said plurality of pixels; and
 said evaluation unit and said control unit being configured to implement at least one of the acquisition of said magnetic resonance data and the evaluation of the acquired magnetic resonance data depending on said magnetic field data.

18. A non-transitory, computer-readable storage medium encoded with programming instructions, said storage medium being loaded into a computerized control and evaluation system of a magnetic resonance apparatus comprising a magnetic resonance data acquisition unit, said programming instructions causing said computerized control and evaluation system to:
 operate the magnetic resonance data acquisition unit to acquire magnetic resonance data from an examination subject in the magnetic resonance data acquisition unit, by exposing the subject in said sequence to multiple alternating fields that prepare respective magnetizations, with respectively different frequencies, of nuclear spins in the examination subject, and implementing a readout sequence for signal values from the examination subject comprising magnetic resonance data representing a plurality of pixels of the examination subject;
 evaluate said magnetic resonance data pixel-by-pixel dependent on the signal values determined after the preparation of the magnetizations for the different frequencies of the alternating fields;
 determine magnetic field data representing spatially resolved information with respect to a basic magnetic field generated in said magnetic resonance data acquisition unit, said spatially resolved information being correlated with said plurality of pixels; and
 implement at least one of the acquisition of said magnetic resonance data and the evaluation of the acquired magnetic resonance data depending on said magnetic field data.

* * * * *